United States Patent [19]
Hughes et al.

[11] Patent Number: 5,215,832
[45] Date of Patent: Jun. 1, 1993

[54] LEAD-FREE MIRRORS AND ENVIRONMENTALLY SAFE MANUFACTURE THEREOF

[75] Inventors: Zephuren J. Hughes, Alvarado, Tex.; Marion M. Jeskey, Northfield, Minn.

[73] Assignee: Cardinal IC Company, Minnetonka, Minn.

[21] Appl. No.: 958,593

[22] Filed: Oct. 8, 1992

Related U.S. Application Data

[63] Continuation of Ser., No. 750,880, Aug. 26, 1991, abandoned, which is a continuation-in-part of PCT/US91/2.811, filed Apr. 24, 1991, which is a continuation-in-part of Ser. No. 686,011, Apr. 12, 1991, abandoned, which is a continuation of Ser. No. 514.109. Apr. 25, 1990, abandoned.

[51] Int. Cl.$^5$ .................. B32B 17/06; C23C 14/08; C23C 14/18; G02B 5/08
[52] U.S. Cl. .................. 428/623; 428/622; 428/626; 428/627; 428/630; 428/632; 428/687; 204/192.27
[58] Field of Search .............. 428/687, 621, 622, 623, 428/624, 626, 631, 632, 633, 673, 457, 469, 627, 630; 350/641, 642; 359/884, 883, 838, 871; 204/192.27

[56] References Cited

U.S. PATENT DOCUMENTS

| | | | |
|---|---|---|---|
| 1,977,639 | 10/1934 | Langdon | 428/687 |
| 2,123,049 | 7/1935 | Irby | 350/642 |
| 4,009,947 | 3/1977 | Nishida et al. | 350/642 |
| 4,340,646 | 7/1982 | Ohno et al. | 428/429 |
| 4,563,400 | 1/1986 | Criss et al. | 428/630 |
| 4,666,263 | 5/1987 | Petcavich | 428/687 |
| 4,690,871 | 9/1987 | Gordon | 428/432 |
| 4,692,389 | 9/1987 | Gillery et al. | 428/630 |
| 4,707,405 | 11/1987 | Evans et al. | 428/336 |
| 4,780,372 | 10/1988 | Tracy et al. | 350/642 |
| 4,880,668 | 11/1989 | Hayes et al. | 428/687 |
| 4,883,721 | 11/1989 | Noleska et al. | 428/623 |
| 4,898,789 | 2/1990 | Finley | 428/623 |
| 4,898,790 | 2/1990 | Finley | 428/623 |
| 4,902,580 | 2/1990 | Gillery | 428/623 |
| 4,948,677 | 8/1990 | Gillery | 428/623 |

FOREIGN PATENT DOCUMENTS

| | | | |
|---|---|---|---|
| 1258659 | 3/1991 | France . | |
| 58-149002 | 9/1983 | Japan | 350/642 |

OTHER PUBLICATIONS

McGraw-Hill Encyclopedia of Science and Technology, vol. II, Sixth Ed. p. 272.
Eagle Zinc Company advertising brochure.
Advertising materials of Heocotech Ltd., entitled "HEUCOPHOS—White, non toxic, anti–corrosive pigments".

*Primary Examiner*—John Zimmerman
*Attorney, Agent, or Firm*—Frederickson & Byron

[57] ABSTRACT

Mirrors are formed in an environmentally compatible and substantially pollution-free manner by a sputtering process in which a transparent substrate such as glass has first sputtered upon it a primer layer and then a reflective layer of silver or other bright reflective metal. A barrier layer is provided over the reflective layer to protect the latter from corrosive environments. If the transmittance of the reflective layer is greater than zero percent, the barrier layer includes a different bright reflective metal sufficient to reduce the transmittance of the combined reflective and barrier layers to zero percent. The mirror includes a lead free polymeric protective layer spaced further from the transparent substrate than the barrier layer. The inclusion of zinc pigment in the polymeric coating provides sulfiding protection, and the use of an outer sputtered on film of zinc or zinc oxide provides substantial adhesion thereto of the polymeric coating.

14 Claims, 1 Drawing Sheet

LEAD-FREE MIRRORS AND ENVIRONMENTALLY SAFE MANUFACTURE THEREOF

This is a continuation of U.S. Pat. application Ser. No. 750,880, filed Aug. 26, 1991, now abandoned, which is a continuation-in-part of PCT/US91/2,811, filed Apr. 24, 1991, which is a continuation-in-part of U.S. Pat. application Ser. No. 686,011, filed Apr. 12, 1991, now abandoned, which is a continuation of U.S. Pat. application Ser. No. 514,109, filed Apr. 25, 1990, now abandoned.

BACKGROUND OF THE INVENTION

Plate glass mirrors have long been made by wet chemistry processes involving polluting chemicals. One well known process involves forming, by means of wet chemistry methods, a thin layer of tin oxide upon a glass sheet, providing next a layer of metallic silver to a thickness sufficient to render the layer substantially opaque (and highly reflective when viewed through the glass), overcoating the silver layer with a layer of copper, and overcoating the copper layer with a lead-based paint. When the silver layer is not completely opaque, the copper layer may impart a very slight copper tint to the mirrored surface viewed through the lass. The copper layer serves also as a sacrificial layer inasmuch as it will react with oxygen and other contaminants with which it may come into contact and thus protect the silver layer from becoming sulfided or oxidized. The lead-based paint not only protects the back of the mirror from being physically abraded by scratches or the like, but the lead oxide pigment further contributes to the sacrificial protection afforded the silver layer and copper layer.

The wet chemistry methods employed for making mirrors as described above have many drawbacks, not the least of which is pollution. The wet chemistry methods involve the use of aqueous coating compositions which may contain various highly contaminating substances. Once a coating solution has been largely exhausted, disposal of the solution poses a substantial environmental problem. Further, the paint that is employed, being of necessity lead based to provide corrosion protection to the silver layer, may also lead to toxic results if the paint becomes accidentally ingested or if lead or lead compounds from discarded or rejected mirrors or wasted paint leaches into landfills to contaminate water supplies.

SUMMARY OF THE INVENTION

We have found that mirrors of excellent quality and high resistance to corrosion can be manufactured through the use of substantially non polluting sputtering techniques and lead free paints to avoid the substantial environmental problems associated with the wet chemistry mirror manufacturing methods of the past.

In a preferred embodiment, we have found that the amount of silver that is employed to manufacture a mirror can be vastly reduced while maintaining the desired reflectivity and mirror color. In another preferred embodiment, a mirror is provided with sputtered on coatings and with an exterior polymeric protective coating that is free of lead or lead compounds and that exhibits tenacious adhesion to the underlying sputtered-on layer to provide substantial protection not only from chemical attack but from scratching and other physical damage as well.

In general, the mirrors of the invention comprise a transparent substrate such as float glass, and a sputtered, transparent primer layer which is carried on the glass surface and which may constitute a metal salt, particularly an oxide or nitride such as an oxide of tin, titanium or zinc or nitrides of zinc or titanium. Upon the primer layer is carried a sputtered reflective metal layer of a bright reflective metal such as silver, aluminum, palladium, platinum or chromium in sufficient amount as to provide the mirror with a transmittance in the range of about 0–30%. In a layer spaced further from the glass surface than the reflective layer is a barrier layer comprising one or more metal compounds different from the metal of the reflective layer and sufficient to protect the reflective layer from contact with contaminants such as water, oxygen, sulfiding gases and the like.

To the extent that the reflective layer is not entirely opaque, the barrier layer includes a layer of a bright metal such as stainless steel, aluminum, or chromium, that is different from the metal of the reflective layer and which cooperates with the silver or other reflective metal in the reflective layer to render the mirror totally opaque. The barrier layer may in fact comprise two contiguous strata, one stratum (nearer the glass surface) comprising aluminum, stainless steel, chromium or other bright metal to supplement the opacity of the reflective layer, and the second stratum comprising a different metal compound that provides good barrier properties, such stratum being formed by sputtering of stainless steel, titanium nitride, silicon nitride, silicon dioxide or titanium dioxide. If a soft metal such as aluminum or copper is employed in the barrier layer to supplement the opacity of the reflective layer, then it is desired that the barrier layer include the second stratum to provide physical and chemical protection to the reflective layer of the mirror.

The outer layer of the mirror is an opaque protective polymer layer such as a paint, this layer preferably being free of lead contamination and being applied from a water-based coating composition. In a preferred embodiment, there is provided immediately below the protective polymer layer a sputtered-on metallic layer of a material such as zinc or zinc oxide, and the polymer layer includes a polymer that is tightly cross-linked and tenaciously adherred to the porous layer. Included in the polymer layer preferably is a pigment comprising one or more zinc compounds such as zinc oxide, zinc phosphate and such other zinc-derived compounds as may be needed to improve the resistance of the mirror to sulfide formation by restraining sulfide ions from coming into contact with the silver or other reflective metal of the reflective layer. The outer, sputtered-on layer of, eg., zinc or zinc oxide and the adherrent polymer layer provide the mirror with substantial resistance to sulfiding and other corrosion.

DESCRIPTION OF THE PREFERRED EMBODIMENT

The metals and metal compositions employed in the present invention are applied by a sputtering technique such as that described in U.S. Pat. No. 4,166,018 (Chapin), the teachings of which are incorporated herein by reference. This technique, sometimes referred to as a magnetron sputtering technique, involves the formation of a plasma which is concentrated in a magnetic field and which serves to eject metal atoms from an adjacent metal target, the metal atoms being deposited upon an adjacent surface such as the surface of a glass pane. When sputtering is done in an inert atmosphere, the metal alone is deposited whereas if sputtering is done in the presence of oxygen or nitrogen, then the metal is deposited as an oxide or, if the metal readily forms a nitride, as a nitride, respectively. Magnetron sputtering techniques and apparatuses are well known in the field and need not be described further.

Figure 1:
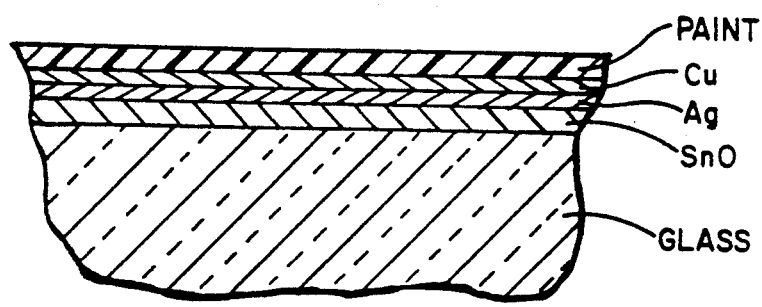
FIG. 1 is a schematic, cross-sectional view showing the layers involved in a mirror of the prior art.

FIG. 1 refers to a prior art mirror which contains a glass sheet as shown bearing sequential tin oxide, silver, copper and paint layers. As noted, paints employed in mirrors of the prior art of this type generally were lead based, and the tin oxide, copper and silver layers were applied using wet chemistry procedures.

Figure 2:
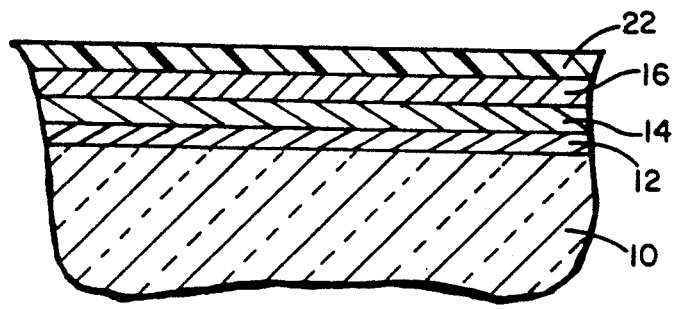
FIG. 2 is a schematic representation of a mirror of the invention utilizing a homogeneous barrier layer.
Figure 3:
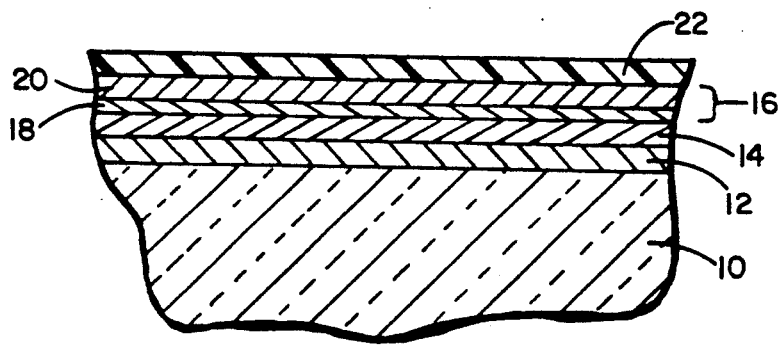
FIG. 3 is a schematic, cross sectional representation of a mirror of the invention in which the barrier layer is a composite layer.

Referring now to FIG. 2, the transparent substrate 10 such as glass and particularly plate glass is first subjected to sputtering in an oxygen/argon or nitrogen/argon atmosphere using a "target" of a metal such as tin, titanium or zinc to provide a tin oxide, titanium dioxide, zinc oxide or zinc nitride primer layer 12. A tin oxide primer layer having a thickness in the range of 5-75 Angstroms would be appropriate. Upon the primer layer is sputtered the layer 14 of a bright, reflective metal such as silver, aluminum, palladium, platinum or chromium in sufficient amount as to provide that layer with a transmittance in the range of 0-30%. The bright, reflective metal preferably is silver. FIG. 2 illustrates the mirror in which the silver or other bright metal layer 12 provides a transmittance of approximately 0%; that is, in which the bright layer is essentially opaque. Sputtered silver layers having thicknesses above about 525 Angstroms and preferably in the range of 525 to 625 Angstroms provide appropriate substantially opaque layers. Preferably, as shown in FIG. 3, the silver or other bright metal layer 14 is not opaque, but rather has a transmittance in the range of approximately 1-30%, preferably 1-10% Sputtered silver layers having thicknesses less than about 525 Angstroms and preferably in the range of 450-525 Angstroms generally exhibit some transmittance. In general, the transmittance of a sputtered silver layer decreases to about 10% or below as its thickness exceeds about 400-450 Angstroms, and decreases to substantially zero as the thickness reaches the 500-550 Angstrom range. A relatively large amount of silver is required to reduce the transmissivity of the reflective layer from several percent to zero. The silver or other bright metal is sputtered from a metal target in an atmosphere of argon or other inert gas.

In the embodiment of FIG. 2, in which the bright, reflective layer 14 has substantially zero transmittance, that layer is overcoated with a protective barrier layer 16, this layer comprising one or more metals or metal alloys that are different from the metal of the reflective layer, the barrier layer being sufficient in thickness and properties to protect the underlying bright metallic layer 14 from contact with contaminants such as water, oxygen, sulfiding gases and the like. The barrier layer desirably contains one or more of the following sputtered materials: stainless steel, aluminum, copper, chromium, titanium nitride, zinc oxide, silicon nitride, titanium dioxide and silicon dioxide.

The barrier layer 16 preferably ranges in thickness from about 100 to about 500 Angstroms; when made of successive layers of stainless steel and titanium nitride, a stainless steel thickness of 310 to 410 Angstroms and a titanium nitride thickness of 150-250 Angstroms provides acceptable results.

Referring to FIG. 3, in which the bright reflective layer 14 is not completely opaque but has a light transmittance in the range of about 1-30% and preferably 1-10%, the protective layer 16 may be a composite layer made of several strata of which one, designated 18 in FIG. 3, is deposited directly upon the bright reflective layer 14 and comprises a bright, reflective metal different from the metal employed in layer 14. Stratum 18 thus may be aluminum, stainless steel, copper or chromium, or for that matter, silver if the reflective layer metal is not silver, and the stratum 18 is applied to a thickness sufficient to render the layers 14 and 18 together substantially completely opaque, that is, with approximately zero transmissivity. For example, the layer 14, if made of silver metal, may have a thickness of approximately 500 plus or minus about 50 Angstroms to provide a transmissivity of about 1-10%; upon this surface then may be coated the stratum 18 of e.g., stainless steel to a thickness of about 300 plus or minus about 50 Angstroms to render the combined layers 14 and 18 substantially opaque. The remaining portion of the barrier layer 16, represented as stratum 20, may in this example be titanium nitride sputtered to a thickness on the order of about 200 plus or minus 50 Angstroms and functions, together with the layer 18, as a barrier layer 16 as described above.

Applied over the barrier layer 16 in the embodiments of FIGS. 2 and 3 is a protective polymeric film 22. The protective film desirably is free of lead, and may be any of several known types of coatings including epoxy resins, urethanes, alkyds, and the like. In one embodiment, a powdered epoxy resin that is capable of melting and fusing when heated is applied to the outer surface of the mirror, for example, over barrier layer 16. The glass sheet may then be passed under heat lamps to heat the epoxy resin to its fusing point, whereupon the epoxy resin melts and fuses into a hard solid coating. A paint or other resinous coating may be applied to the outer surface of the mirror by spraying, roller coating or other means as may be desired. The polymeric layer 22 desirably has a dry thickness in the range of 0.5-4.0 mils, and preferably in the range of 1.5-1.8 mils.

In the most preferred embodiment, the paint includes a curable polymer system desirably comprising a crosslinkable polymer such an acrylic resin and a suitable curing agent therefor such an an aminoplast (eg., a melamine resin) or phenoplast resin, the polymer system being supplied as an aqueous solution or suspension. Acrylic resins are preferred, and are capable of crosslinking at moderate temperatures to form extremely hard, protective films. Epoxy polymer systems and acrylic systems, and particularly the latter, are preferred because of the hard, scratch-resistent films that are produced. Moreover, these films are highly resistant to hydrolysis and resist degradation even in warm, humid environments.

The polymer coating systems desirably are provided as aqueous coating compositions, that is, as solutions or suspension in water, the composition being desirably free or nearly free of organic solvents. As mentioned earlier, the polymer coatings desirably are free of lead or lead compounds.

It has been further found that great adhesion between the outer sputtered on coating and the paint can be obtained by over coating the sputtered on film with the paint from an aqueous coating composition. Increased adhesion of the polymer layer (as measured by a "tape" test described below) is particularly evident when the outer sputtered on layer is zinc or particularly a zinc compound such as zinc oxide, and the polymer ingredient of the paint is an acrylic that is heat-curable to form an extremely hard surface, the acrylic being applied from an aqueous solution or dispersion. Without being bound by the following explanation, it appears that the coating composition is carried into intimate contact with the metal or metal oxide (eg., zinc or zinc oxide) surface, and appears to actually penetrate that surface. When the coating is cured, (ie., when it has been cross-linked by application of heat, curing agents, catalysts or the like), an exceedingly strong physical or mechanical bond is formed between the polymeric coating and the underlying sputtered film. Thus, the final sputtered on layer desirably has a surface that is readily wetted by the aqueous paint composition and with which the polymer can form a strong mechanical bond.

The cured paint films derived from the aqueous paint compositions employed as described above are characterized as being highly resistant to hydrolysis and resistant to softening in most household cleaning chemicals such as dilute ammonium hydroxide, vinegar and the like. As noted above, the films also have quite hard surfaces, and preferably are rated 2H or greater in pencil hardness. Heat-curable polymeric systems employing acrylic polymers, that is, polymers resulting from the copolymerization of acrylic and/or methacrylic acid and other acrylic monomers, are known in the field of paint chemistry and need not be described further.

Adhesion of the protective polymeric layer to the sputtered-on film stack can be measured, at least on a comparative basis, by a test in which the cured polymeric film is scored using a diamond or other hard, sharp object, sets of parallel score lines crossing one another to define a diamond shaped pattern in the polymeric layer. A length of adhesive tape (3M Company s Scotch brand Magic Mending tape is appropriate) is then pressed into intimate adhesive contact with the scored surface. A free end of the tape is then stripped away rapidly from the polymeric surface at right angles to the coated glass sheet. When an epoxy-based paint is coated upon a protective titanium nitride layer (eg., layer 20 in FIG. 3), small "diamonds" of paint can be lifted from the titanium nitride surface. When a sputtered coating having a zinc or zinc oxide outer surface is employed and is overcoated with an aqueous acrylic resin coating, the adhesion between the polymer coating and the sputtered on film is so great that the tape strips away none of the polymer coating in the tape adhesion test, and in fact the adhesive of the tape is transferred to the polymer coating.

The aqueous polymer coatings of the invention also desirably contain pigment, and it has been found that the choice of pigment is important in providing mirrors of the invention with further and better resistance to sulfiding. Pigments comprising one or more zinc compounds give particularly good anti-sulfiding properties. The zinc compounds employed in the pigment may include zinc oxide and other water-insoluble zinc compounds, particularly the various water-insoluble zinc salts such as zinc phosphate, the latter being particularly preferred. The zinc compounds desirably provide at least about 5% and preferably at least about 8% by weight (as elemental zinc) based on the solids of the paint compositions.

The anti-sulfiding properties conferred by the zinc based pigments thus mentioned appear to be particularly beneficial when the underlying final sputtered on layer is zinc or a zinc based compound such as zinc oxide. This coating can be sputtered from a zinc cathode in an atmosphere containing oxygen to form the oxide directly, or metallic zinc can be sputtered on in a nitrogen atmosphere or an atmosphere of a relatively non-reactive or inert gas such as argon, the zinc oxidizing readily upon exposure to air.

Water based polymeric coating compositions, such as the acrylic composition referred to above, can be coated, dried and cured quickly. The acrylic-based coating compositions of the invention, utilizing zinc-based pigments, are slightly more viscous than water, and may be coated upon upwardly facing, sputter-coated faces of horizontally moving glass sheets using curtain coating procedures that are known in the coating art. Curtain coating involves the formation of a downwardly moving liquid curtain of an appropriate coating composition, the curtain being of substantially uniform thickness throughout its width and the curtain itself being deposited downwardly upon the horizontally moving surface of the coated glass panes.

The wet coating thus applied may first be subjected to a high volume flow of warm, dry air to flash off a large portion of the water and to render the coating self-supporting and substantially dry to the touch, following which the coated pane may be cured in, eg., a forced air oven at about 350° F. for typically a period of 3–5 minutes, the polymer undergoing substantially complete curing. Heat curing may be accomplished in one or more elongated forced air ovens through which the panes pass horizontally. The resulting panes may be cooled down rapidly by means of ambient air flow and, if desired, a warm water quench. Cured polymer film thicknesses of up to 4.0 mils or above can be employed. The thickness of the cured paint film desirably is not greater than about 1.8 mils and preferably is in the range of about 1.5–1.8 mils, the reduced thickness enabling the aqueous polymeric composition to be applied and cured more rapidly on the sputter coated surface of the glass pane, and this thickness further provides substantial protection to the underlying film.

In a preferred embodiment, the polymeric overcoating is applied in the form of two layers, the first comprising a pigmented layer as described above and the second being a clear coat, that is, a pigment-free layer. The pigmented and pigmented-free polymeric layers may be applied one over the other using the curtain coating techniques described above, and the second layer may be placed upon the first layer when the first layer is yet wet. Some physical intermixing occurs between the wet layers to improve adhesion therebetween, and the outer clear coat provides substantial protection against inadvertent scratching of the resulting product. Typical coating thicknesses of the cured pigmented layer may be in the range of 1.0 mils and the clear coat may be in the range of about 0.5 mils in thickness.

Figure 4:
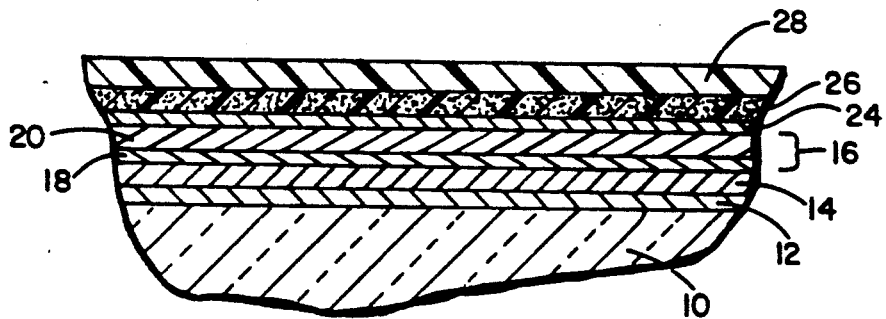
FIG. 4 is a schematic, cross-sectional representation of another modification of a mirror of the invention.

Referring now to FIG. 4, the transparent glass substrate 10 contains a primer layer 12 of eg., tin oxide, a reflective layer 14 of eg., silver, and a barrier layer 16, the barrier layer containing a first film or stratum 18 of stainless steel or the like to supplement the opacity provided by the silver layer 14, if needed. The second barrier layer stratum 20, of titanium nitride or the like, is then provided. The outer sputtered on layer, designated 24 in FIG. 4, may be zinc or a zinc compound such as the oxide, and the thickness of this layer may vary widely. Thicknesses in the range of about 50 Angstroms to 1000 Angstroms or more can be used, and thicknesses of about 100 Angstroms to about 900 Angstroms are preferred. If zinc is deposited as the metal in a sputtering operation, and the metallic surface is then exposed to the air, oxidation of the metallic film occurs to form an approximately stoichiometric ZnO surface, the atomic ratio of oxygen to zinc decreasing beneath the surface. Upon this layer is deposited a first pigmented polymeric coating 26, followed by a second, unpigmented "clear coat" 28.

The following illustrative examples will serve to explain the invention in greater detail. The "measured thicknesses" reported in the examples were measured by X-ray photoelectron spectroscopy ("XPS") using a Perkin-Elmer Model 5500 XPS spectrophotometer.

EXAMPLE I

Glass panes, suitably cleaned, were subjected to magnetron sputtering procedures from a series of target cathodes. The amount of each material that was thus sputter coated was controlled by varying the number of cathodes beneath which the glass panes were passed during the coating operation. Directly upon the glass surface was deposited a layer of tin oxide from a tin cathode operating in an oxygen-argon environment, the tin oxide layer being deposited to an estimated approximate thickness of about 50 Angstroms.

The glass panes were then overcoated with silver metal from a silver cathode operating in an argon atmosphere, the silver layer being deposited to a measured thickness of approximately 500 Angstroms to provide a reflective layer having a transmittance of approximately 2%. Sputtered on top of the silver layer was a stainless steel (316) layer to a measured thickness of approximately 310 Angstroms, the transmissivity of the silver and stainless steel layers being essentially zero. Over the stainless steel layer was sputter coated a layer of titanium nitride from a titanium metal electrode operating in a nitrogen environment. The titanium nitride protective layer was applied to a measured thickness of approximately 210 Angstroms. Finally, over the titanium nitride layer was coated a commercial lead-free, pigmented alkyd-based paint to a coating weight of 8 grams per square foot, that is, to a thickness of 1.2 mils.

EXAMPLE II

Glass panes, cleaned and coated with a primer layer of tin oxide as in Example I, were then overcoated with silver metal sputtered from a silver cathode in an argon atmosphere to a measured thickness of approximately 570 Angstroms. The silver layer exhibited a transmissivity of zero percent. Sputtered on top of the silver layer were sequential layers of stainless steel and titanium nitride, as in Example I, to measured thicknesses of approximately 360 Angstroms and 210 Angstroms, respectively. Finally, the mirror was overcoated with a lead-free, pigmented, alkyd-based paint as in Example I.

The mirrors resulting from Examples I and II each exhibited excellent reflectivity. Each mirror was tested by subjecting a freshly cut edge of the mirror to a 20% salt spray for 2000 hours to determine the weathering resistance of the mirror. Neither mirror showed any evidence of "black edge", that is, silver corrosion from the edges. Black edge is a common problem in the mirror industry. There also was no evidence of massive pin holes or oxidation of the metal coating due to improper mirror backing. The occasional small pin holes were well within mirror specifications. Ammonia tests were also performed. A freshly cut edge of each mirror was subjected to a 15% ammonia vapor solution for 24 hours without failure, indicating excellent resistance, failure being judged the same as with the above salt spray. Finally, a bevel was ground into a freshly cut edge of each mirror, and the bevelled edge was subjected to the salt spray and ammonia tests described above. Similarly excellent results were obtained.

EXAMPLE III

Glass panes, cleaned and coated with a sputter coated primer layer of tin oxide as in Example I, are then provided with a silver metal coating, a stainless steel coating and a titanium nitride coating, all as described in Example II. Upon the titanium nitride coating may be sputtered coated a film of zinc from a zinc metal electrode operating in a nitrogen atmosphere, this coating being applied to a thickness of approximately 900 Angstroms. After exposure of the film to ambient air, the film was found in one such run to have an outer surface that was approximately stoichiometric zinc oxide, the atomic ratio of oxygen to zinc decreasing below the stoichiometric amount at depths of several hundred Angstroms into the film surface.

Once the panes have emerged from the magnetron sputter coating apparatus, the panes travel on a conveyor beneath a coating apparatus which applies to the upper, sputter coated surfaces of the panes a predetermined layer of uniform thickness of an aqueous, lead-free, pigmented, acrylic paint composition. Although the paint may be applied via several coating methods, it is preferred that the paint be caused to flow downwardly in the form of a "curtain" upon the upper surface of the moving glass panes. The paint, at approximately 50% solids, is deposited at a wet thickness of approximately 2 mils. To quickly dry the wet paint film, the film is subjected to a high volumetric flow rate of dry, warm air to quickly remove water from the film and to provide the film with a semi-hard surface; at this point, the film may yet be soft enough to retain fingerprints. The continuously moving glass panes are subjected to the high volume flow of warm air for approximate one minute, following which the panes pass through one or more ovens capable of heating the panes and the paint to a temperature in which the polymeric component of the paint rapidly cross links and becomes extremely hard and scratch resistent. For example, the panes may be exposed to hot air at 350° F. for a period of 3–5 minutes, during which the temperature of the glass is raised to 280° F.

The temperature of the panes emerging from the curing ovens may be rapidly reduced by treating the panes, particularly the glass side thereof, with warm water and a gentle flow of tempered air, the temperature of the glass rapidly being reduced to 80 F. or below. The final paint thickness may be on the order of 1 mil.

The aqueous pigmented paint composition thus described may have the following composition:

| Ingredient | Quantity Parts by Weight |
| --- | --- |
| water reduced acrylic thermosetting resin 71% solids (Rhone-Poulenc resin CMD-9012) | 195.74 |
| triethylamine | 17.38 |
| water | 217.25 |
| butyl cellosolve EB (Union Carbide) | 43.45 |
| isopropyl alcohol, 91% | 26.07 |
| amorphous precipitated silica (Degussa, OK-412) | 17.38 |
| titanium dioxide | 108.625 |
| silicone defoamer (Patcote 520) | 0.261 |
| hydrophobic amorphous fumed silica (Degussa, Aerosil R-972) | 1.043 |
| organo nitrogen zinc salt (Henkel, Alcophor 827) | 8.69 |
| zinc phosphate (Heubach, Heucophos ZPO) | 86.90 |
| carbon black | 4.345 |
| barium sulfate | 173.80 |
| methylated melamine (Monsanto, Resimene 717, 84%) | 99.066 |
| TOTAL | 1000 parts |

If desired, the pigmented base coat thus described may be provided with a non-pigmented overcoat desirably utilizing the same or similar acrylic resin capable of cross linking to form a hard, scratch-resistant surface. The non-pigmented paint may have the following composition:

| Ingredient | Quantity Parts by Weight |
| --- | --- |
| water reduced acrylic thermosetting resin (Rhone-Poulenc CMD-9012, 71%) | 368.01 |
| triethylamine | 34.632 |
| water | 432.90 |
| deithylene glycol monobutly ether | 30.303 |
| methylalkyl polysiloxane (Byk-Chemie, Byk-325) | 1.039 |
| silicone defoamer (Patcote 520) | .649 |
| methylated melamine (Monsanto, Resimene 717, 84%) | 129.870 |
| polyethylene wax (Micro Powders, MPP-620VF wax) | 2.597 |
| TOTAL | 1000 parts |

While a preferred embodiment of the present invention has been described, it should be understood that various changes, adaptations and modifications may be made therein without departing from the spirit of the invention and the scope of the appended claims.

What is claimed is:

1. A mirror comprising a transparent substrate, a sputtered primer layer carried on the transparent substrate, a reflective layer comprising a bright, reflective metal sputtered onto the primer layer, and a barrier layer spaced further from the transparent substrate than the reflective layer and comprising one or more metal compounds different from the metal of the reflective layer, the barrier layer being of sufficient thickness to protect the reflective layer from corrosive environments, the barrier layer including a sufficient amount of a bright, reflective metal different from the reflective metal of the reflective layer to reduce the transmittance of the combined reflective layer and barrier layer to zero percent if the transmittance of the reflective layer is greater than zero percent, and the barrier layer including an outer sputtered-on zinc-containing layer, the mirror including, over the zinc-containing layer and tightly adherent thereto, a hydrolysis and solvent-resistant, hard, pigmented polymeric protective layer applied from an aqueous composition.

2. The mirror of claim 1 wherein the sputtered-on, zinc containing layer comprises an outer surface of zinc oxide in contact with the polymeric protective layer.

3. The mirror of claim 2 wherein the pigmented polymeric protective layer includes one or more zinc-containing pigments sufficient to improve the resistance of the mirror to sulfiding.

4. The mirror of claim 3 wherein the zinc pigment includes zinc phosphate.

5. The mirror of any one of claims 1-4 including a separate outer coating of a non-pigmented polymeric coating.

6. The mirror of any of claims 1-4 wherein the outer polymeric protective layer is a crosslinked acrylic resin.

7. A mirror comprising a transparent substrate, a sputtered primer layer carried on the transparent substrate, a reflective layer comprising a bright, reflective metal sputtered onto the primer layer, and a barrier layer spaced further from the transparent substrate than the reflective layer and comprising one or more metal compounds different from the metal of the reflective layer, the barrier layer being of sufficient thickness to protect the reflective layer from corrosive environments, the barrier layer including a sufficient amount of a bright, reflective metal different from the reflective metal of the reflective layer to reduce the transmittance of the combined reflective layer and barrier layer to zero percent if the transmittance of the reflective layer is greater than zero percent, and the barrier layer including an outer sputtered-on zinc-containing layer having a zinc oxide outer surface, the mirror including, over the zinc-containing layer and tightly adherent thereto, a hydrolysis and solvent-resistant, hard, crosslinked acrylic protective layer including zinc-containing pigment sufficient to improve the resistance of the mirror to sulfiding.

8. Method of manufacturing mirrors in a substantially pollution-free manner, comprising the steps of
   a. sputtering onto a transparent substrate a primer layer, a bright, reflective metallic layer, and a barrier layer spaced further from the transparent substrate than the reflective layer, the barrier layer including a sufficient amount of a bright, reflective metal different from the reflective metal of the reflective layer to reduce the transmittance of the combined reflective layer and barrier layer to zero percent if the transmittance of the reflective layer is greater than zero percent, the barrier layer containing a final layer having a zinc oxide outer surface,
   b. applying to the zinc oxide outer surface an aqueous coating composition comprising a heat-curable polymer system, the coating composition thoroughly wetting the zinc oxide surface, and
   c. evaporating water from the coating and curing the coating onto the zinc oxide surface to provide the latter with a hard, tenaceously adherent, protective polymeric overcoat.

9. The substantially pollution free method of claim 8 including the step of providing over said polymeric layer a second polymeric coating composition, and heat curing the latter coating.

10. The substantially pollution-free method of claim 9 wherein said second polymeric coating composition is applied over the first coating while the first coating is wet, and the coatings are cured together in a single curing step.

11. The substantially pollution-free method of claim 8 including the step of providing in the coating composition sufficient zinc pigments to increase the resistance of the mirror to sulfiding.

12. Method of manufacturing mirrors in a substantially pollution-free manner, comprising the steps of
   a. sputtering onto a transparent substrate a bright, reflective metallic layer, and a barrier layer spaced further from the transparent substrate than the reflective layer, the barrier layer containing a final layer having a zinc oxide outer surface,
   b. applying to the zinc oxide outer surface an aqueous coating composition comprising a heat-curable polymer system comprising an acrylic resin and a curing agent therefor, the coating composition thoroughly wetting the zinc oxide surface and including sufficient zinc pigments to increase the resistance of the mirror to sulfiding, and
   c. evaporating water from the coating and heat-curing the coating onto the zinc oxide surface to provide the latter with a hard, tenaceously adherent, protective polymeric overcoat.

13. The substantially pollution-free method of claim 12 including the step of providing over the agent-containing polymeric layer a coating of an aqueous, pigment-free, heat curable polymeric coating composition, and heat curing the latter coating.

14. The substantially pollution-free method of claim 13 in which the pigment-free coating composition is applied as a wet film over the pigmented coating while the latter is in a wet film stage.

* * * * *